United States Patent
Yang et al.

(10) Patent No.: US 12,406,955 B2
(45) Date of Patent: Sep. 2, 2025

(54) POWER DISTRIBUTION DEVICE, POWER DISTRIBUTION SYSTEM AND MANUFACTURING METHOD THEREOF

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Sheng-Fan Yang, Hsinchu (TW); Yao-Tsu Chen, Hsinchu (TW)

(73) Assignees: GLOBAL UNICHIP CORPORATION, Hisinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 338 days.

(21) Appl. No.: 17/652,281

(22) Filed: Feb. 24, 2022

(65) Prior Publication Data

US 2023/0223370 A1    Jul. 13, 2023

(30) Foreign Application Priority Data

Jan. 13, 2022    (TW) .................. 111101472

(51) Int. Cl.
*H01L 23/00*    (2006.01)
(52) U.S. Cl.
CPC .............. *H01L 24/16* (2013.01); *H01L 24/17* (2013.01); *H01L 24/81* (2013.01); *H01L 2224/16225* (2013.01); *H01L 2924/14253* (2013.01)

(58) Field of Classification Search
CPC ......... H01L 24/16; H01L 24/17; H01L 24/81; H01L 2224/16225; H01L 2924/14253; H01L 24/13
USPC ........................................................ 257/737
See application file for complete search history.

(56) References Cited

U.S. PATENT DOCUMENTS

| | | | |
|---|---|---|---|
| 4,322,778 A | 3/1982 | Barbour et al. | |
| 5,847,936 A | 12/1998 | Forehand et al. | |
| 6,828,666 B1 | 12/2004 | Herrell et al. | |
| 8,700,347 B2 | 4/2014 | Spanier et al. | |

(Continued)

FOREIGN PATENT DOCUMENTS

| | | | |
|---|---|---|---|
| CN | 103852194 B | 1/2018 | |
| CN | 113794364 A | * 12/2021 | |

(Continued)

*Primary Examiner* — Norman D Richards
*Assistant Examiner* — Laura M Dykes
(74) *Attorney, Agent, or Firm* — CKC & Partners Co., LLC

(57) ABSTRACT

A power distribution device includes a substrate, a first chip, a first bump, a second bump and a first capacitor. The first chip is configured to receive a first reference voltage signal and a second reference voltage signal. The first bump is located between the substrate and the first chip, and configured to transmit the first reference voltage signal from the substrate to the first chip. The second bump is located between the substrate and the first chip, and configured to transmit the second reference voltage signal from the substrate to the first chip. The first capacitor is located above the substrate and below the first chip. A first terminal of the first capacitor is coupled to the first bump, and a second terminal of the first capacitor is coupled to the second bump. A power distribution system is also disclosed herein.

9 Claims, 6 Drawing Sheets

(56) References Cited

U.S. PATENT DOCUMENTS

| | | |
|---|---|---|
| 2019/0385941 A1 | 12/2019 | Lai et al. |
| 2020/0083779 A1 | 3/2020 | Huang et al. |
| 2021/0126333 A1 | 4/2021 | Nakano et al. |
| 2021/0159166 A1* | 5/2021 | Oikawa ................ H05K 1/0253 |
| 2021/0296278 A1* | 9/2021 | Yen ......................... H01L 25/10 |

FOREIGN PATENT DOCUMENTS

| | | | |
|---|---|---|---|
| JP | H03283901 A | * | 12/1991 |
| JP | H1056660 A | * | 2/1998 |
| JP | 2008135772 A | * | 6/2008 |
| TW | I501567 B | | 9/2015 |
| TW | I719131 B | | 2/2021 |
| TW | 202147550 A | | 12/2021 |

\* cited by examiner

POWER DISTRIBUTION DEVICE, POWER DISTRIBUTION SYSTEM AND MANUFACTURING METHOD THEREOF

CROSS-REFERENCE TO RELATED APPLICATION

This application claims priority to Taiwan Application Serial Number 111101472, filed Jan. 13, 2022, which is herein incorporated by reference in its entirety.

BACKGROUND

Technical Field

The present disclosure relates to a power distribution technique. More particularly, the present disclosure relates to a power distribution device and a power distribution system.

Description of Related Art

In the field of high-speed analog front end design, a chip needs to receive a reference voltage signal of a clock domain to perform dynamic operations. However, in high frequency applications, such as 5G applications, the reference voltage signal is likely to generate noises, such that the dynamic performance of the chip is poor. Thus, techniques associated with the development for overcoming the problems described above are important issues in the field.

SUMMARY

The present disclosure provides a power distribution device. The power distribution device includes a substrate, a first chip, a first bump, a second bump and a first capacitor. The first chip is configured to receive a first reference voltage signal and a second reference voltage signal. The first bump is located between the substrate and the first chip, and configured to transmit the first reference voltage signal from the substrate to the first chip. The second bump is located between the substrate and the first chip, and configured to transmit the second reference voltage signal from the substrate to the first chip. The first capacitor is located above the substrate and under the first chip, a first terminal of the first capacitor being coupled to the first bump, a second terminal of the first capacitor being coupled to the second bump.

The present disclosure provides a power distribution system. The power distribution system includes a power supplier and a power distribution device. The power distribution device includes a printed circuit board, a first chip, a first bump, a second bump, a substrate and a first capacitor. The printed circuit board is configured to receive the first reference voltage signal and the second reference voltage signal. The first chip is configured to receive a third reference voltage signal corresponding to the first reference voltage signal and a fourth reference voltage signal corresponding to the second reference voltage signal. The first bump is located between the substrate and the first chip. The second bump is located between the substrate and the first chip. The substrate is located between the printed circuit board and the first bump, configured to transmit the third reference voltage signal to the first bump, and configured to transmit the fourth reference voltage signal to the second bump. The first capacitor is located above the substrate and under the first chip, a first terminal of the first capacitor being coupled to the first bump, a second terminal of the first capacitor being coupled to the second bump.

The present disclosure provides a method of manufacturing a power distribution system. The method includes: disposing a first bump between a substrate and a first chip; coupling, by the first bump, the substrate to the first chip; disposing a second bump between the substrate and the first chip; coupling, by the second bump, the substrate to the first chip; disposing a first capacitor above the substrate and under the first chip; and coupling a first terminal of the first capacitor and a second terminal of the first capacitor to the first bump and the second bump, respectively. The first bump and the second bump are configured to receive different reference voltage signals, respectively.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
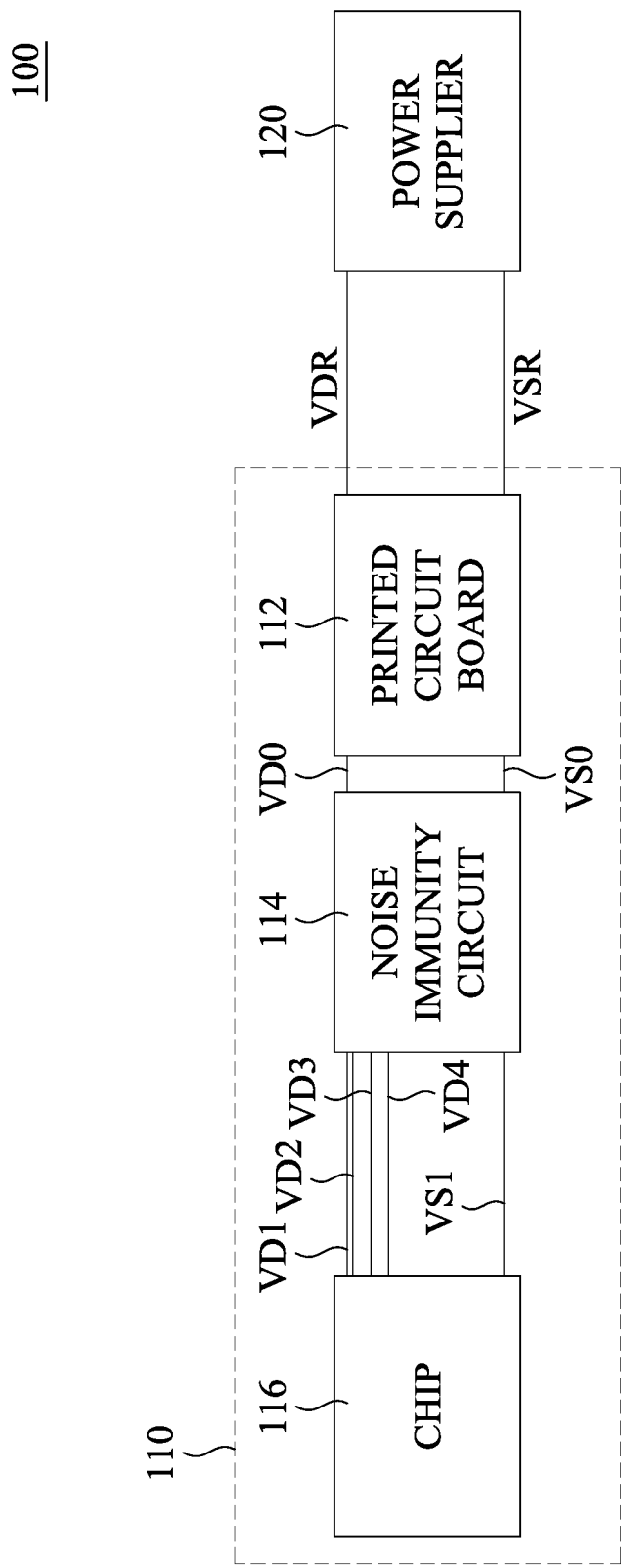
FIG. 1 is a schematic diagram of a power distribution system illustrated according to some embodiments of this disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic diagram of a power distribution system 100 illustrated according to some embodiments of this disclosure. As illustratively shown in FIG. 1, the power distribution system 100 includes a power distribution device 110 and a power supplier 120. In some embodiments, the power supplier 120 is configured to provide reference voltage signals VDR and VSR to the power distribution device 110.

In some embodiments, the power distribution device 110 includes a printed circuit board 112, a noise immunity circuit 114 and a chip 116. As illustratively shown in FIG. 1, the printed circuit board 112 is coupled to the power supplier 120 and the noise immunity circuit 114. The noise immunity circuit 114 is coupled to the printed circuit board 112 and the chip 116. In some embodiments, the chip 116 may be implemented as a die.

In some embodiments, the printed circuit board 112 is configured to output a reference voltage signal VD0 according to the reference voltage signal VDR, and is configured to output a reference voltage signal VS0 according to the reference voltage signal VSR. In some embodiments, the noise immunity circuit 114 is configured to output reference voltage signals VD1-VD4 according to the reference voltage signal VD0, and is configured to output a reference voltage signals VS1 according to the reference voltage signal VS0. The noise immunity circuit 114 is further configured to reduce noises of the reference voltage signals VD1-VD4 and VS1. In some embodiments, the chip 116 is configured to operate according to the reference voltage signals VD1-VD4 and VS1. In some embodiments, voltage levels of the reference voltage signals VDR and VD0-VD4 are approximately 0.9 volt, and voltage levels of the reference voltage signals VSR, VS0 and VS1 are approximately 0 volt.

Figure 2:
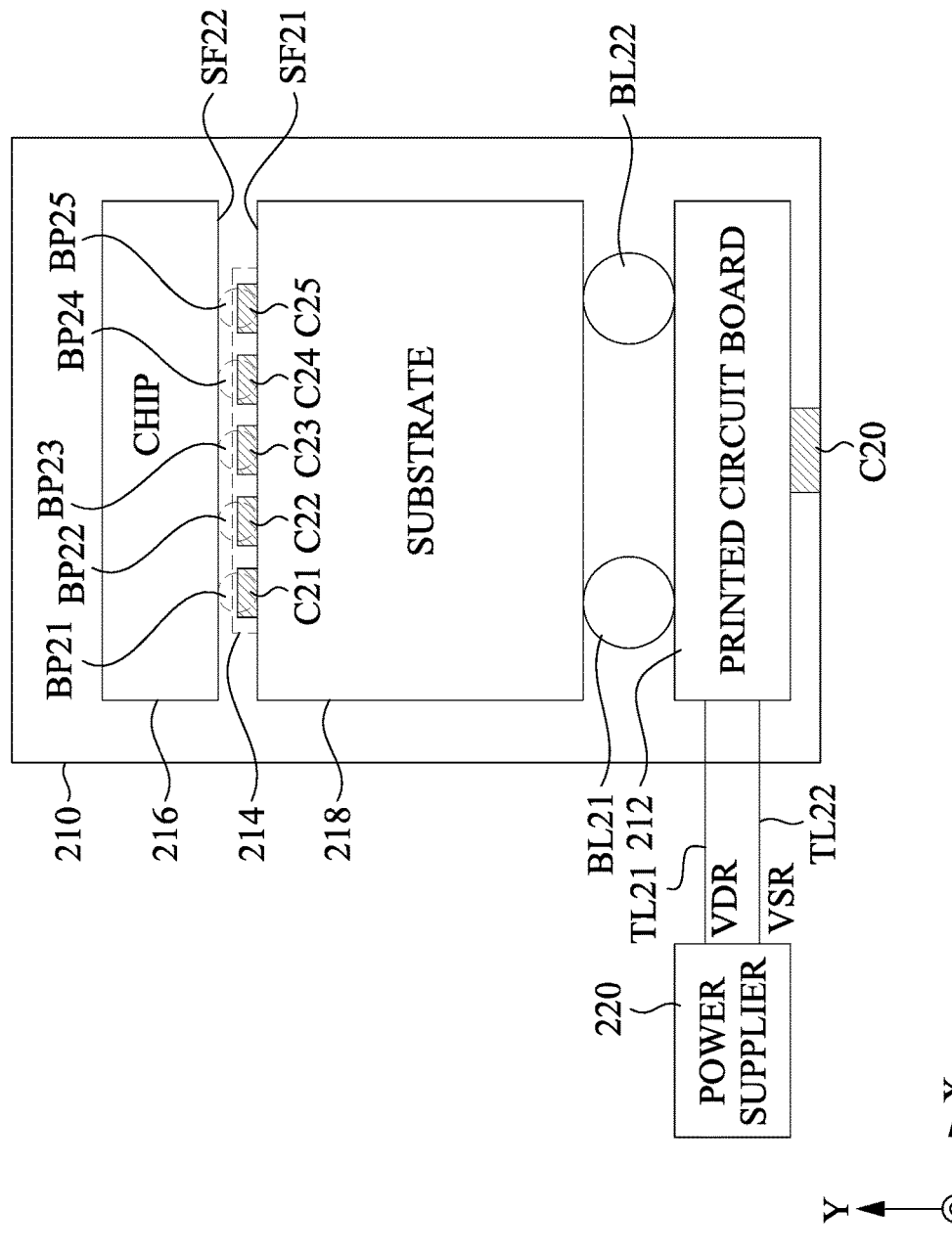
FIG. 2 is a schematic diagram of a power distribution system illustrated according to some embodiments of this disclosure.

FIG. 2 is a schematic diagram of a power distribution system 200 illustrated according to some embodiments of this disclosure. As illustratively shown in FIG. 2, the power distribution system 200 includes a power distribution device 210 and a power supplier 220. In some embodiments, the power supplier 220 is configured to provide the reference voltage signals VDR and VSR to the power distribution device 210 through the transmission lines TL21 and TL22, respectively.

As illustratively shown in FIG. 2, the power distribution device 210 includes a printed circuit board 212, a noise immunity circuit 214, a chip 216, a substrate 218, bumps BP21-BP25 and conductive balls BL21, BL22. Referring to FIG. 1 and FIG. 2, the power distribution system 200 is an embodiment of the power distribution system 100. The power supplier 220, the printed circuit board 212, the noise immunity circuit 214 and the chip 216 correspond to the power supplier 120, the printed circuit board 112, the noise immunity circuit 114 and the chip 116, respectively. Therefore, some descriptions are not repeated for brevity. In some embodiments, the bumps BP21-BP25 and the conductive balls BL21, BL22 may be constructed by conductors, and materials of the conductors may be gold, copper or other conductive metal materials.

As illustratively shown in FIG. 2, the conductive balls BL21 and BL22 are located between the substrate 218 and the printed circuit board 212. The noise immunity circuit 214 is located above the substrate 218 and located under the chip 216, and is abutted with the substrate 218 at a surface SF21 of the substrate 218. The bumps BP21-BP25 are located between the substrate 218 and the chip 216, are abutted with the substrate 218 at the surface SF21 of the substrate 218, and are abutted with the chip 216 at a surface SF22 of the chip 216. In some embodiments, the substrate 218 is implemented as a package substrate.

In the embodiments shown in FIG. 2, the right side corresponds to an X-direction, the top side corresponds to a Y-direction, and a Z direction points into the paper. In some embodiments, the bumps BP21-BP25 are arranged in the X-direction in order, and are configured beside the noise immunity circuit 214 in the Z-direction.

In some embodiments, the printed circuit board 212 is configured to output the reference voltage signals VD0 and VS0 according to the reference voltage signals VDR and VSR. The conductive balls BL21, BL22 are configured to transmit the reference voltage signals VD0 and VS0 to the substrate 218, respectively. The substrate 218 is configured to generate multiple reference voltage signals, such as the reference voltage signals VD1-VD4 and VS1 shown in FIG. 1, according to the reference voltage signals VD0 and VS0. The bumps BP21-BP25 are configured to transmit the multiple reference voltage signals described above to the chip 216. For example, the bumps BP21-BP24 are configured transmit the reference voltage signals VD1-VD4 to the chip 216, respectively.

In some embodiments, the noise immunity circuit 214 includes capacitors C21-C25. In some embodiments, the capacitors C21-C25 are coupled to the bumps BP21-BP25, respectively, to reduce noises of the reference voltage signals transmitted by the bumps BP21-BP25. For example, in an embodiment that the bumps BP21-BP25 are configured to transmit the reference voltage signals VD1-VD4, respectively, the bumps BP21-BP24 are configured to reduce noises of the reference voltage signals VD1-VD4, respectively.

In some embodiments, the power distribution device 210 further includes a capacitor C20. As illustratively shown in FIG. 2, the capacitor C20 is located under the printed circuit board 212. In some embodiments, the capacitor C20 is coupled to the transmission lines TL21 and TL22 to reduce noises of the reference voltage signals VDR and VSR.

Figure 3:
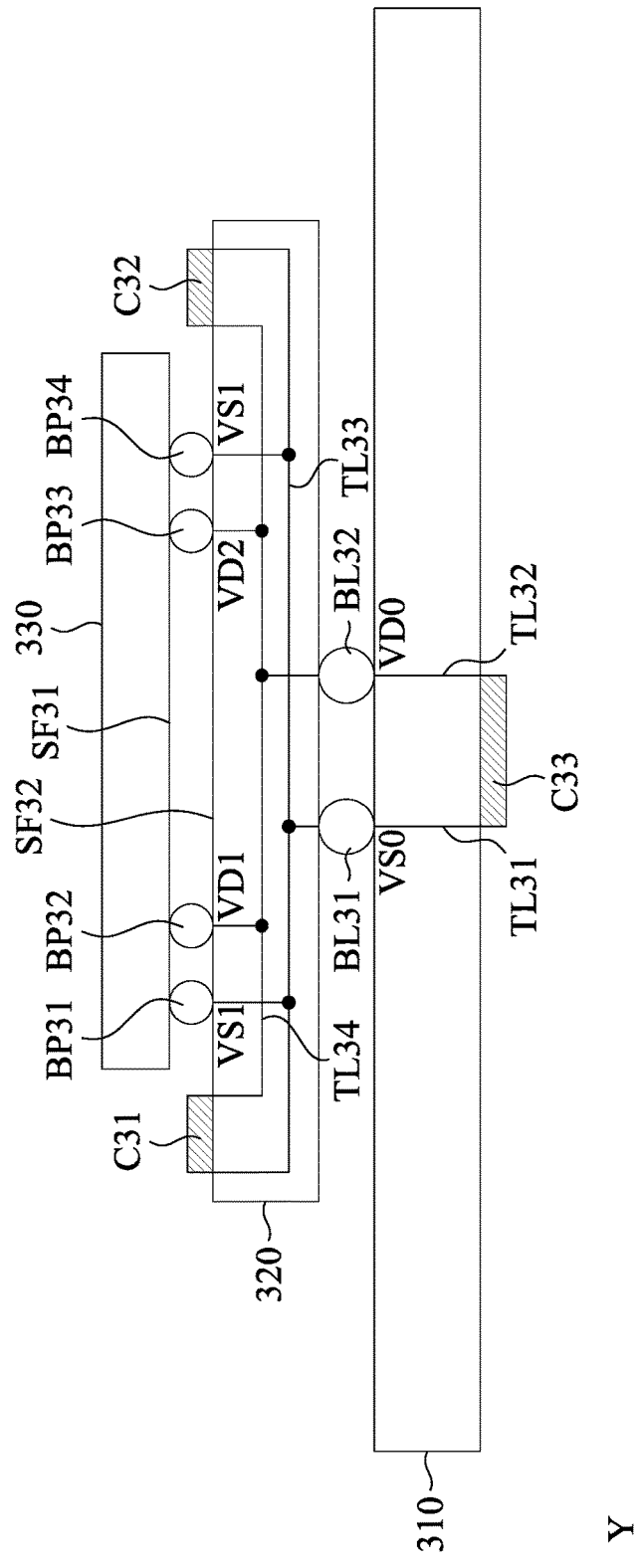
FIG. 3 is a schematic diagram of a power distribution device illustrated according to some embodiments of this disclosure.

FIG. 3 is a schematic diagram of a power distribution device 300 illustrated according to some embodiments of this disclosure. As illustratively shown in FIG. 3, the power distribution device 300 includes a printed circuit board 310, a chip 330, a substrate 320, a capacitor C31, bumps BP31, BP32 and conductive balls BL31, BL32. Referring to FIG. 2 and FIG. 3, the power distribution device 300 is an embodiment of the power distribution device 210. The conductive balls BL31, BL32, the printed circuit board 310, the chip 330 and the substrate 320 correspond to the conductive balls BL21, BL22, the printed circuit board 212, the chip 216 and the substrate 218, respectively. The capacitor C31 corresponds to the noise immunity circuit 214, and the bumps BP31 and BP32 correspond to two of the bumps BP21-BP25. Therefore, some descriptions are not repeated for brevity.

As illustratively shown in FIG. 3, the conductive balls BL31 and BL32 are located between the substrate 320 and the printed circuit board 310. The capacitor C31 is located above the substrate 320 and located under the chip 330, and is abutted with the substrate 320 at a surface SF32 of the substrate 320. The bumps BP31 and BP32 are located between the substrate 320 and the chip 330, wherein bumps BP31 and BP32 are abutted with the substrate 320 at the surface SF32 of the substrate 320 and are abutted with the chip 330 at a surface SF31 of the chip 330.

In the embodiments shown in FIG. 3, the right side corresponds to the Z-direction, the top side corresponds to the Y-direction, and the X-direction points out the paper. In some embodiments, the capacitor C31 and the bumps BP31 and BP32 are arranged in the Z-direction in order.

In some embodiments, the printed circuit board 310 includes transmission lines TL31 and TL32. As illustratively shown in FIG. 3, the transmission line TL31 is configured to transmit the reference voltage signal VS0 to the conductive ball BL31, and the transmission line TL32 is configured to transmit the reference voltage signal VD0 to the conductive ball BL32.

In some embodiments, the substrate 320 includes transmission lines TL33 and TL34. As illustratively shown in FIG. 3, the transmission line TL34 is configured to receive the reference voltage signal VD0 from the conductive ball BL32, and output the reference voltage signal VD1 to the bump BP32 according to the reference voltage signal VD0. The transmission line TL33 is configured to receive the reference voltage signal VS0 from the conductive ball BL31, and output the reference voltage signal VS1 to the bump BP31 according to the reference voltage signal VS0. In some embodiments, a voltage level of the reference voltage signal VD1 is substantially equal to a voltage level of the reference voltage signal VD0, and a voltage level of the reference voltage signal VS1 is substantially equal to a voltage level of the reference voltage signal VS0. In some embodiments, the bumps BP31 and BP32 are configured to transmit the reference voltage signal VS1 and VD1 to the chip 330, respectively, such that the chip 330 operates according to the reference voltage signal VS1 and VD1.

As illustratively shown in FIG. 3, a terminal of the capacitor C31 is coupled to the bump BP31 through the transmission line TL33, and another terminal of the capacitor C31 is coupled to the bump BP32 through the transmission line TL34. In some embodiments, the capacitor C31 is configured to reduce noises of the reference voltage signal VS1 and VD1.

In some approaches, bumps on a substrate are configured to transmit reference voltage signals to a chip, such that the chip operates according to the reference voltage signals. However, the chip or a power supplier generating the reference voltage signals may generate additional simultaneous switching noises or noises induced by variation of inductances or currents, such that a dynamic performance of the chip is poor.

Compared to the above approaches, in some embodiments of the present disclosure, the capacitor C31 disposed on the substrate 320 is coupled to the bumps BP31 and BP32 to reduce the noises of the reference voltage signal VS1 and VD1, to improve the dynamic performance of the chip 330.

In some embodiments, the power distribution device 300 further includes bumps BP33, BP34 and a capacitor C32. As illustratively shown in FIG. 3, the capacitor C32 is located above the substrate 320 and located under the chip 330, and is abutted with the substrate 320 at the surface SF32 of the substrate 320. The bumps BP33 and BP34 are located between the substrate 320 and the chip 330, wherein bumps BP33 and BP34 are abutted with the substrate 320 at the surface SF32 of the substrate 320 and are abutted with the chip 330 at the surface SF31 of the chip 330. The bumps BP33, BP34 and the capacitor C32 are configured beside the bump BP32 in the Z-direction, and are arranged in order in the Z-direction.

As illustratively shown in FIG. 3, the bump BP33 is coupled to the conductive ball BL32 through the transmission line TL34, and the bump BP34 is coupled to the conductive ball BL31 through the transmission line TL33. In some embodiments, the transmission line TL33 is configured to receive the reference voltage signal VS0 from the conductive ball BL31, and output the reference voltage signal VS1 to the bump BP34 according to the reference voltage signal VS0. The transmission line TL34 is configured to receive the reference voltage signal VD0 from the conductive ball BL32, and output the reference voltage signal VD2 to the bump BP33 according to the reference voltage signal VD0. In some embodiments, a voltage level of the reference voltage signal VD2 is substantially equal to a voltage level of the reference voltage signal VD0.

As illustratively shown in FIG. 3, a terminal of the capacitor C32 is coupled to the bump BP34 through the transmission line TL33, and another terminal of the capacitor C32 is coupled to the bump BP33 through the transmission line TL34. In some embodiments, the capacitor C32 is configured to reduce noises of the reference voltage signals VD2 and VS1.

As illustratively shown in FIG. 3, a distance between the capacitor C32 and the bump BP33 is smaller than a distance between the capacitor C31 and the bump BP33, and a distance between the capacitor C31 and the bump BP32 is smaller than a distance between the capacitor C32 and the bump BP32. Each of the capacitor C32 and C31 is configured to reduce the noises of a corresponding one with a shorter distance of the bumps BP32 and BP33. In some embodiments, the distance between the capacitor C31 and the bump BP32 is smaller than or approximately equal to a thousand and four hundred micrometers, and the distance between the capacitor C32 and the bump BP33 is smaller than or approximately equal to a thousand and four hundred micrometers.

In some approaches, capacitors are far away from bumps on a substrate, and multiple bumps share one capacitor, such that the effectiveness of reducing noises is poor.

Compared to the above approaches, in some embodiments of the present disclosure, the capacitor C31 is disposed on the substrate 320 and is close to the bump BP32, to reduce the noises of the reference voltage signal VD1 of the bump BP32. The capacitor C32 is disposed on the substrate 320 and is close to the bump BP33, to reduce the noises of the reference voltage signal VD2 of the bump BP33. The noises of each of the bumps BP32 and BP33 is reduced by the closer one of the capacitors C31 and C32, such that the effectiveness of reducing noises is improved.

In some embodiments, the power distribution device 300 further includes a capacitors C33. As illustratively shown in FIG. 3, the capacitors C33 is located under the printed circuit board 310, and is coupled to the transmission lines TL31 and TL32 to reduce the noises of the reference voltage signals VD0 and VS0.

Figure 4:
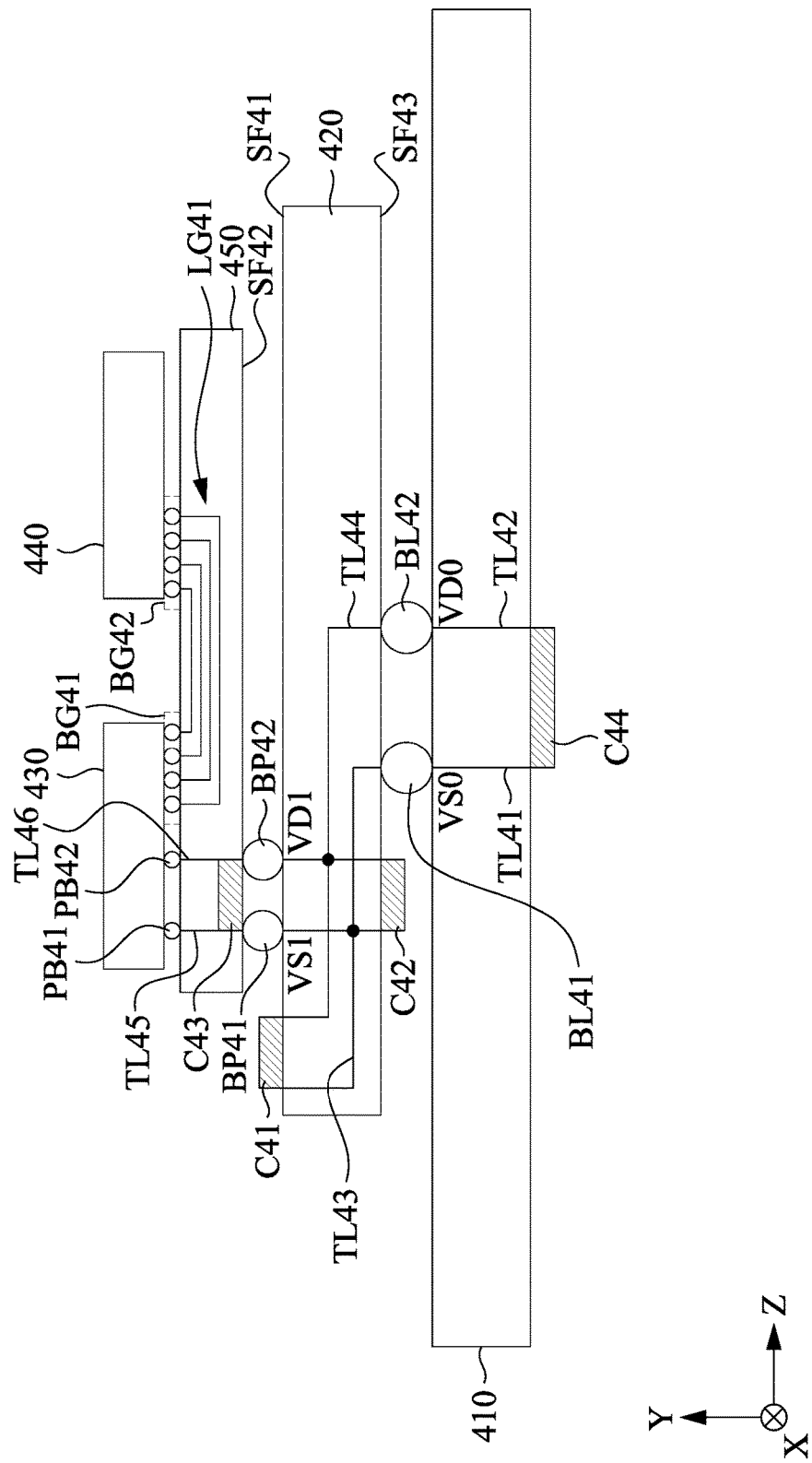
FIG. 4 is a schematic diagram of a power distribution device illustrated according to some embodiments of this disclosure.

FIG. 4 is a schematic diagram of a power distribution device 400 illustrated according to some embodiments of this disclosure. As illustratively shown in FIG. 4, the power distribution device 400 includes a printed circuit board 410, chips 430, 440, a substrate 420, an intermediate layer 450, capacitors C41-C43, bumps BP41, BP42, PB41, PB42, bump groups BG41, BL42 and conductive balls BL41, BL42. Referring to FIG. 3 and FIG. 4, the power distribution device 400 is an embodiment of the power distribution device 300. The conductive balls BL41, BL42, the printed circuit board 410, the chip 430 and the substrate 420, the capacitor C41 and the bumps BP41, BP42 correspond to the conductive balls BL31, BL32, the printed circuit board 310, the chip 330 and the substrate 320, the capacitor C31 and the bumps BP31, BP32, respectively. Therefore, some descriptions are not repeated for brevity.

As illustratively shown in FIG. 4, conductive balls BL41 and BL42 are located between the substrate 420 and the printed circuit board 410, and are abutted with the substrate 420 at a surface SF43 of the substrate 420. The capacitor C41 is located above the substrate 420 and located under the intermediate layer 450, and is abutted with the substrate 420 at a surface SF41 of the substrate 420. The bumps BP41 and BP42 are located between the substrate 420 and the intermediate layer 450, are abutted with the substrate 420 at a surface SF41 of the substrate 420, and are abutted with the intermediate layer 450 at a surface SF42 of the intermediate layer 450. The capacitor C42 is located under the substrate 420, and is abutted with the substrate 420 at the surface SF43 of the substrate 420. The capacitor C42 is located in the intermediate layer 450, and is abutted with the surface SF42 of the intermediate layer 450. The bumps BP41, BP42 and the bump group BG41 are located between the chip 430 and the intermediate layer 450. The bump group BL42 is located between the chip 440 and the intermediate layer 450.

In the embodiments shown in FIG. 4, the right side corresponds to the Z-direction, the top side corresponds to the Y-direction, and the X-direction points out the paper. In some embodiments, the capacitor C41 and the bumps BP41 and BP42 are arranged in the Z-direction in order on the surface SF41. In some embodiments, the capacitor C42 and conductive balls BL41, BL42 are arranged in the Z-direction in order on the surface SF43.

In some embodiments, the printed circuit board 410 includes transmission lines TL41 and TL42. As illustratively shown in FIG. 4, the transmission line TL41 is configured to transmit the reference voltage signal VS0 to the conductive ball BL41, and the transmission line TL42 is configured to transmit the reference voltage signal VD0 to the conductive ball BL42.

In some embodiments, the substrate 420 includes transmission lines TL43 and TL44. As illustratively shown in FIG. 4, the transmission line TL44 is configured to receive the reference voltage signal VD0 from the conductive ball BL42, and output the reference voltage signal VD1 to the bump BP42 according to the reference voltage signal VD0. The transmission line TL43 is configured to receive the reference voltage signal VS0 from the conductive ball BL41, and output the reference voltage signal VS1 to the bump BP41 according to the reference voltage signal VS0.

In some embodiments, the intermediate layer 450 includes transmission lines TL45 and TL46. As illustratively shown in FIG. 4, the transmission line TL45 is coupled to the bump BP41 and PB41, and the transmission line TL46 is coupled to the bump BP42 and PB42. In some embodiments, the transmission line TL45 is configured to transmit the reference voltage signal VS1 from the bump BP41 to the bump PB41, and transmission line TL46 is configured to transmit the reference voltage signal VD1 from the bump BP42 to the bump PB42.

As illustratively shown in FIG. 4, a terminal of the capacitor C41 is coupled to the bump BP41 through the transmission line TL43, and another terminal of the capacitor C41 is coupled to the bump BP42 through the transmission line TL44. A terminal of the capacitor C42 is coupled to the bump BP41 through the transmission line TL43, and another terminal of the capacitor C42 is coupled to the bump BP42 through the transmission line TL44. A terminal of the capacitor C43 is coupled to the bump BP41 and the transmission line TL45, and another terminal of the capacitor C43 is coupled to the bump BP42 and the transmission line TL46. In some embodiments, the capacitors C41-C43 are configured to reduce the noises of the reference voltage signal VS1 and VD1. In some embodiments, the distances between each of the capacitors C41-C43 and the bumps BP41 and BP42 are smaller than or approximately equal to a thousand and four hundred micrometers. In some embodiments, the capacitor C43 may be implemented as a deep trench capacitor.

In some embodiments, the intermediate layer 450 further comprises a transmission line group LG41. As illustratively shown in FIG. 4, the transmission line group LG41 is coupled the bump groups BG41 and BG42. In some embodiments, the transmission line group LG41 and the bump groups BG41, BG42 are configured to transmit the reference voltage signals VD1 and VS1 to the chip 440, such that the chip 440 operates according to the reference voltage signals VD1 and VS1.

Figure 5:
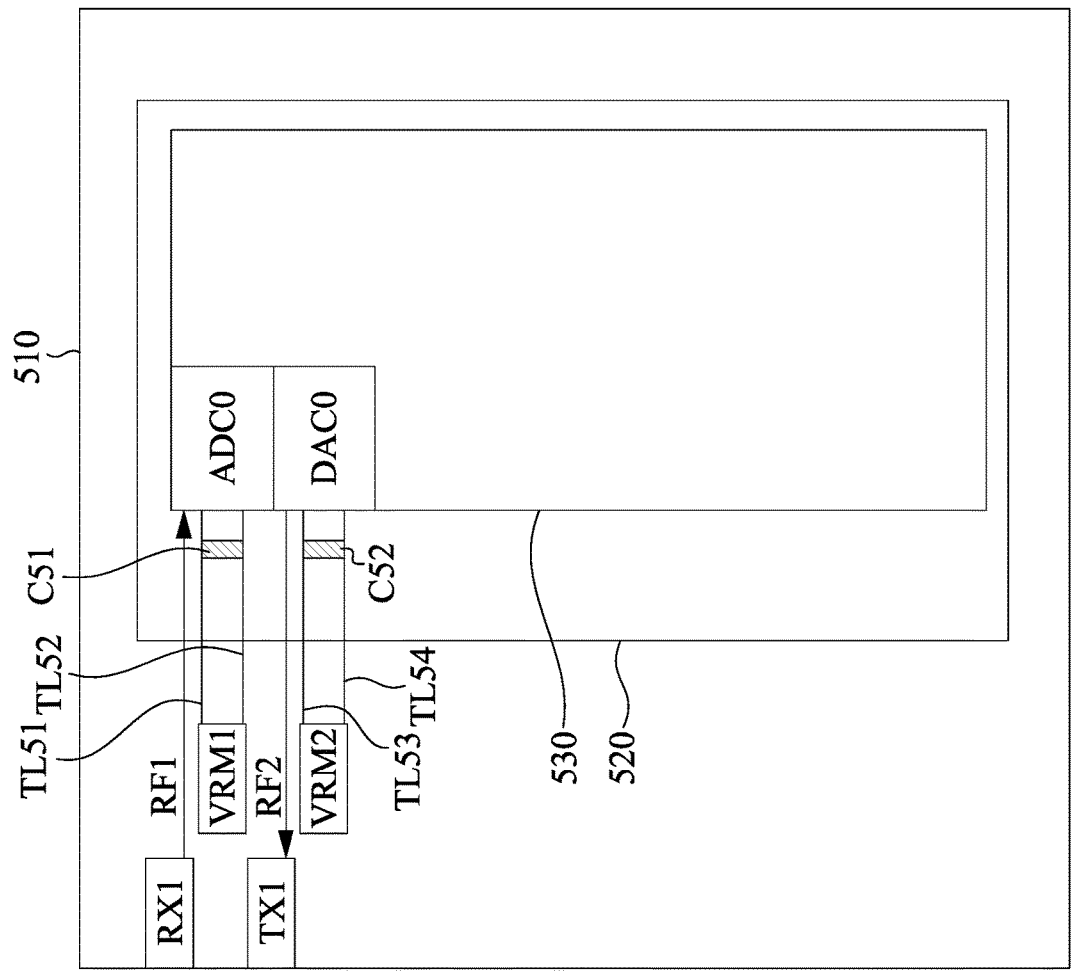
FIG. 5 is a top view diagram of a power distribution system illustrated according to some embodiments of this disclosure.

FIG. 5 is a top view diagram of a power distribution system 500 illustrated according to some embodiments of this disclosure. As illustratively shown in FIG. 5, the power distribution system 500 includes a printed circuit board 510, a substrate 520, a chip 530 and capacitors C51, C52. The substrate 520 is disposed above the printed circuit board 510. The chip 530 and the capacitors C51, C52 are disposed above the substrate 520.

Referring to FIG. 5 and FIG. 2, the power distribution system 500 is an embodiment of the power distribution system 200. The printed circuit board 510, the substrate 520 and the chip 530 correspond to the printed circuit board 212, the substrate 218 and the chip 216, respectively. The capacitors C51 and C52 correspond to the noise immunity circuit 214. Therefore, some descriptions are not repeated for brevity.

Referring to FIG. 5 and FIG. 3, the printed circuit board 510, the substrate 520 and the chip 530 correspond to the printed circuit board 310, the substrate 320 and the chip 330, respectively. The capacitors C51 and C52 may be implemented as the capacitors C31 and C32. Therefore, some descriptions are not repeated for brevity. In some embodiments, the printed circuit board 510 is coupled the substrate 520 through the conductive balls BL31 and BL32, and the substrate 520 is coupled to the chip 530 through the bumps BP31-BP34.

In some embodiments, the power distribution system 500 further includes power suppliers VRM1, VRM2 and transmission lines TL51-TL54. The power supplier VRM1 is configured to provide reference voltage signals, such as the reference voltage signals VD1 and VS1 shown in FIG. 3, to the chip 530 through the transmission lines TL51 and TL52. The power supplier VRM2 is configured to provide reference voltage signals, such as the reference voltage signals VD2 and VS1 shown in FIG. 3, to the chip 530 through the transmission lines TL53 and TL54. In the embodiment shown in FIG. 5, the power suppliers VRM1 and VRM2 are disposed above the printed circuit board 510. In various embodiments, the power suppliers VRM1 and VRM2 may be implemented as a voltage regulator module.

As illustratively shown in FIG. 5, a terminal of the capacitor C51 is coupled to the transmission line TL51, and another terminal of the capacitor C51 is coupled to the transmission line TL52. A terminal of the capacitor C52 is coupled to the transmission line TL53, and another terminal of the capacitor C52 is coupled to the transmission line TL54. In some embodiments, the distances between each of the capacitors C51 and C52 and the chip 530 are smaller than or approximately equal to a thousand and four hundred micrometers.

Referring to FIG. 3 and FIG. 5, in some embodiments, the capacitor C51 may be implemented as the capacitors C31 and C32, the transmission line TL51 may be implemented as the transmission line TL34, and the transmission line TL52 may be implemented as the transmission line TL33. Moreover, the capacitor C52 may be implemented as the capacitors C31 and C32, the transmission line TL53 may be implemented as the transmission line TL34, and the transmission line TL54 may be implemented as the transmission line TL33.

In some embodiments, the power supplier VRM1 is configured to generate the reference voltage signals VD0 and VS0, the transmission line TL52 is configured to output the reference voltage signal VS1 according to the reference voltage signal VS0, and the transmission line TL51 is configured to output the reference voltage signal VD1 according to the reference voltage signal VD0. In some embodiments, the power supplier VRM2 is configured to generate the reference voltage signals VD0 and VS0, the transmission line TL54 is configured to output the reference voltage signal VS1 according to the reference voltage signal VS0, and the transmission line TL53 is configured to output the reference voltage signal VD2 according to the reference voltage signal VD0.

In some embodiments, the chip 530 includes an analog to digital converter ADC0 and a digital to analog converter DAC0. As illustratively shown in FIG. 5, the analog to digital converter ADC0 is coupled to the transmission lines TL51 and TL52 to receive reference voltage signals, such as the reference voltage signals VD1 and VS1 shown in FIG. 3. The digital to analog converter DAC0 is coupled to the transmission lines TL53 and TL54 to receive reference voltage signals, such as the reference voltage signals VD2 and VS1 shown in FIG. 3. In some embodiments, the analog to digital converter ADC0 is configured to operate according to the reference voltage signals VD1 and VS1, and the digital to analog converter DAC0 is configured to operate according to the reference voltage signals VD2 and VS1. In some embodiments, the analog to digital converter ADC0 may also operate according to the reference voltage signal VD2, and the digital to analog converter DAC0 may also operate according to the reference voltage signal VD1.

In some embodiments, the power distribution system 500 further includes antennas RX1 and TX1. As illustratively shown in FIG. 5, the antenna RX1 is configured to transmit a radio frequency signal RF1 to the analog to digital converter ADC0. The antenna TX1 is configured to receive a radio frequency signal RF2 from the digital to analog converter DAC0. In some embodiments, a frequency of the radio frequency signals RF1 and RF2 is larger than of approximately equal to one GHz.

In some approaches, when a chip receives a high frequency signal, such as a radio frequency signal with frequency larger than of approximately equal to one GHz, a reference voltage signal received by the chip generates noises easily.

Compared to the above approaches, in some embodiments of present disclosure, when the analog to digital converter ADC0 receives the radio frequency signal RF1, the capacitor C51 coupled to the analog to digital converter ADC0 may reduce noises of the reference voltage signal received by the analog to digital converter ADC0.

In the embodiment shown in FIG. 5, the power suppliers VRM1, VRM2 and the antennas RX1, TX1 are disposed above the printed circuit board 510. In various embodiments, the power suppliers VRM1, VRM2 and the antennas RX1, TX1 may also be disposed at other positions.

Figure 6:
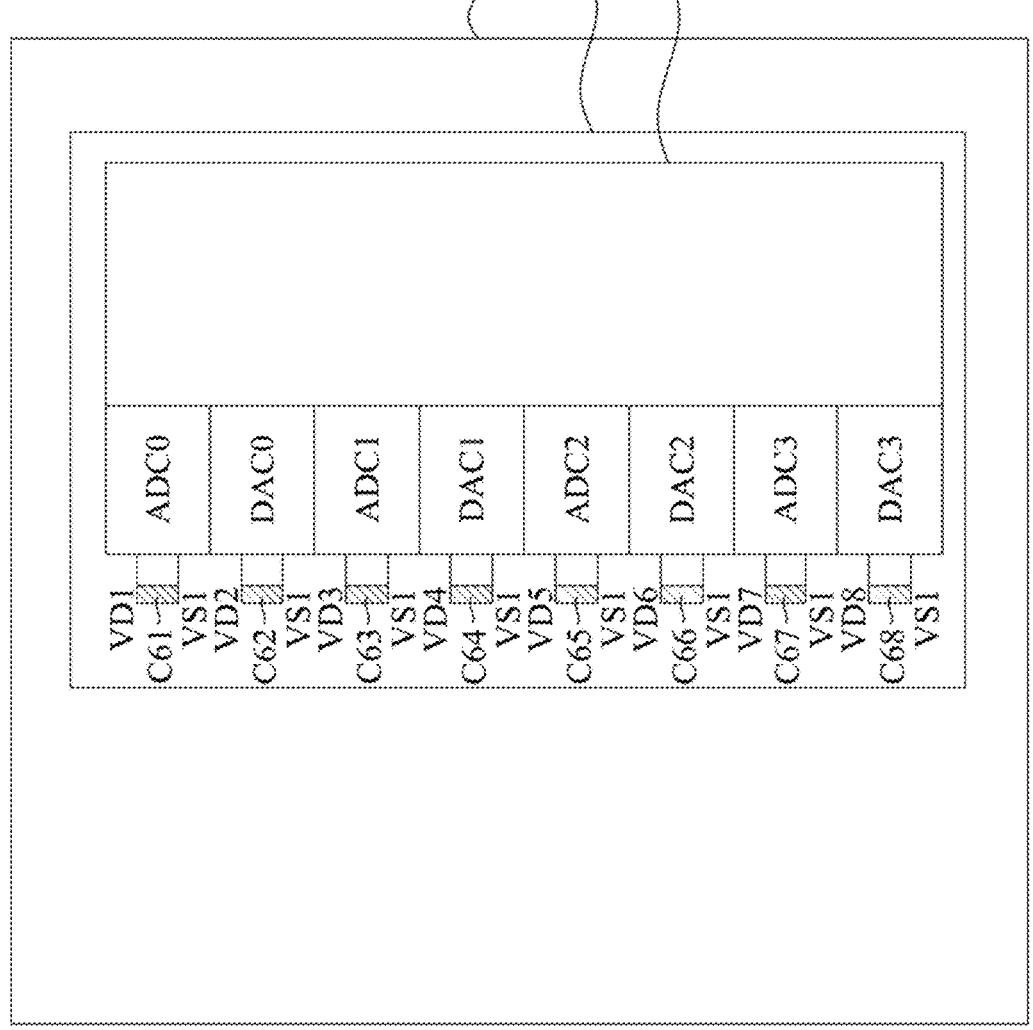
FIG. 6 is a top view diagram of a power distribution system illustrated according to some embodiments of this disclosure.

FIG. 6 is a top view diagram of a power distribution system 600 illustrated according to some embodiments of this disclosure. As illustratively shown in FIG. 6, the power distribution system 600 includes a printed circuit board 610, a substrate 620, a chip 630 and capacitors C61-C68. The substrate 620 is disposed above the printed circuit board 610. The chip 630 and the capacitors C61-C68 are disposed above the substrate 620.

Referring to FIG. 5 and FIG. 6, the power distribution system 600 is an embodiment of the power distribution system 500. The printed circuit board 610, the substrate 620 and the chip 630 correspond to the printed circuit board 510, the substrate 520 and the chip 530, respectively. Operations of the capacitors C61-C68 are similar with the operations of the capacitors C51 and C52. Therefore, some descriptions are not repeated for brevity.

In some embodiments, the chip 630 includes analog to digital converters ADC0-ADC3 and digital to analog converters DAC0-DAC3. As illustratively shown in FIG. 6, the analog to digital converters ADC0-ADC3 are configured to receive reference voltage signals VD1, VD3, VD5 and VDZ, respectively, and the digital to analog converters DAC0-DAC3 are configured to receive reference voltage signals VD2, VD4, VD6 and VD8, respectively. Each of the analog to digital converters ADC0-ADC3 and the digital to analog converters DAC0-DAC3 is configured to receive the reference voltage signal VS1. The analog to digital converters ADC0-ADC3 are coupled to the capacitors C61-C64, respectively. The digital to analog converters DAC0-DAC3 are coupled to the capacitors C65-C68, respectively.

As illustratively shown in FIG. 6, the capacitors C61-C68 are configured to receive reference voltage signals VD1-VD8, respectively, to reduce the noises of the reference voltage signals VD1-VD8. In some embodiments, each of the capacitors C61-C68 is further configured to reduce the noises of the reference voltage signal VS1. In some embodiments, distances between each of the capacitors C61-C68 and the chip 630 are smaller than or approximately equal to a thousand and four hundred micrometers.

In summary, in some embodiments of present disclosure, in the power distribution device 300 shown in FIG. 3, the capacitor C31 disposed on the substrate 320 is coupled to the bumps BP31 and BP32, to reduce the noises of the reference voltage signals VD1 and VS1, such that performances of the chip 330 are improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power distribution system, comprising:
   at least one power supplier configured to provide a first reference voltage signal and a second reference voltage signal; and
   a printed circuit board configured to receive the first reference voltage signal and the second reference voltage signal;
   a substrate coupled to the printed circuit board and configured to output a third reference voltage signal and a fourth reference voltage signal according to the first reference voltage signal, and output a fifth reference voltage signal according to the second reference voltage signal;
   a first chip coupled to the substrate and configured to receive the third reference voltage signal, the fourth reference voltage signal and the fifth reference voltage signal;
   a first bump located between the substrate and the first chip, and configured to transmit the third reference voltage signal from the substrate to the first chip;
   a second bump located between the substrate and the first chip, and configured to transmit the fifth reference voltage signal from the substrate to the first chip; and
   a first capacitor located above the substrate and under the first chip, a first terminal of the first capacitor being coupled to the first bump, a second terminal of the first capacitor being coupled to the second bump;
   a third bump located between the substrate and the first chip, and configured to transmit the fourth reference voltage signal from the substrate to the first chip;
   a fourth bump located between the substrate and the first chip, and configured to transmit the fifth reference voltage signal from the substrate to the first chip;
   a second capacitor located above the substrate and under the first chip, a first terminal of the second capacitor being coupled to the third bump, a second terminal of the second capacitor being coupled to the fourth bump,
   wherein, the first capacitor, the second bump, the first bump, the third bump, the fourth bump and the second capacitor are arranged in order;
   a first analog to digital converter; and
   a first digital to analog converter,
   wherein the at least one power supplier is coupled to the first analog to digital converter through a first transmission line and a second transmission line, a first terminal of the first capacitor is coupled to the first transmission line, and a second terminal of the first capacitor is coupled to the second transmission line,
   wherein the at least one power supplier is coupled to the first digital to analog converter through a third transmission line and a fourth transmission line directly, a first terminal of the second capacitor is coupled to the third transmission line, and a second terminal of the second capacitor is coupled to the fourth transmission line, and
   the power distribution system further comprises:
   a first antenna configured to transmit a first radio frequency signal to the first analog to digital converter; and
   a second antenna configured to receive a second radio frequency signal from the first digital to analog converter, wherein the first antenna is different from the second antenna.

2. The power distribution system of claim 1, wherein the first analog to digital converter is configured to operate according to the third reference voltage signal and the fifth reference voltage signal.

3. The power distribution system of claim 2,
   wherein the first digital to analog converter is coupled to the second capacitor, and configured to operate according to the fourth reference voltage signal and the fifth reference voltage signal,
   wherein the second capacitor is different from the first capacitor, and the fifth reference voltage signal is different from the third reference voltage signal.

4. The power distribution system of claim 2,
   wherein a frequency of the first radio frequency signal is larger than one GHz.

5. The power distribution system of claim 1, further comprising:
   a plurality of the first capacitors disposed on the substrate, wherein the first chip comprising:
   a plurality of the analog to digital converters coupled to the plurality of first capacitors, respectively.

6. The power distribution system of claim 5, further comprising:
   a plurality of the second capacitors disposed on the substrate, wherein the first chip further comprising:
   a plurality of the digital to analog converters coupled to the plurality of second capacitors, respectively,
   wherein distances between each of the plurality of first capacitors and the first chip are smaller than or approximately equal to a thousand and four hundred micrometers, and
   distances between each of the plurality of second capacitors and the first chip are smaller than or approximately equal to a thousand and four hundred micrometers.

7. A method of manufacturing a power distribution system, comprising:

disposing a first bump, a second bump, a third bump and a fourth bump between a substrate and a first chip;

coupling, by the first bump, the second bump, the third bump and the fourth bump, the substrate to the first chip;

disposing a first capacitor and a second capacitor above the substrate and under the first chip;

coupling a first terminal of the first capacitor and a second terminal of the first capacitor to the first bump and the second bump, respectively;

coupling a first terminal of the second capacitor and a second terminal of the second capacitor to the third bump and the fourth bump, respectively;

coupling an analog to digital converter to the first capacitor; and coupling an digital to analog converter to the second capacitor, wherein at least one power supplier is coupled to the analog to digital converter through a first transmission line and a second transmission line, the first terminal of the first capacitor is coupled to the first transmission line, and the second terminal of the first capacitor is coupled to the second transmission line, wherein the at least one power supplier is coupled to the digital to analog converter through a third transmission line and a fourth transmission line directly, a first terminal of the second capacitor is coupled to the third transmission line, and a second terminal of the second capacitor is coupled to the fourth transmission line, wherein the first bump and the second bump are configured to receive a first reference voltage signal and a second reference voltage signal, respectively, the third bump and the fourth bump are configured to receive a third reference voltage signal and the second reference voltage signal, respectively, the first capacitor, the second bump, the first bump, the third bump, the fourth bump and the second capacitor are arranged in order, and the power distribution system comprises:

a first antenna configured to transmit a first radio frequency signal to the analog to digital converter; and a second antenna configured to receive a second radio frequency signal from the digital to analog converter, wherein the first antenna is different from the second antenna.

8. The method of claim 7, wherein a distance between the second capacitor and the third bump is shorter than a distance between the first capacitor and the third bump, and a distance between the first capacitor and the second bump is shorter than a distance between the second capacitor and the second bump.

9. The method of claim 7, further comprising:

receiving, by the analog to digital converter, the first radio frequency signal with a frequency larger than one GHz.

* * * * *